United States Patent [19]

Smith

[11] Patent Number: 4,728,772

[45] Date of Patent: Mar. 1, 1988

[54] VAPOR SOURCE ASSEMBLY WITH ADJUSTABLE MAGNETIC POLE PIECES

[75] Inventor: P. A. Joel Smith, San Pablo, Calif.

[73] Assignee: The BOC Group, Inc., Montvale, N.J.

[21] Appl. No.: 886,866

[22] Filed: Jul. 16, 1986

[51] Int. Cl.⁴ ............................................. B23K 15/00
[52] U.S. Cl. .............................. 219/121 EF; 373/14;
    373/11
[58] Field of Search ................ 219/121 EF, 121 EG;
    373/11-14, 16, 17

[56] References Cited

U.S. PATENT DOCUMENTS

| | | | |
|---|---|---|---|
| 3,483,417 | 7/1967 | Hanks | 313/156 |
| 3,710,072 | 1/1973 | Shrader et al. | 219/121 EB |
| 4,064,352 | 12/1977 | Mann | 373/13 |
| 4,131,753 | 12/1978 | Tsujimoto et al. | 373/11 |
| 4,429,401 | 1/1984 | Avicola | 373/12 |
| 4,620,081 | 10/1986 | Zeren | 219/121 EF |

OTHER PUBLICATIONS

Assembly Drawing and Parts List for STIH-270-1 Electron Beam Source from Temescal Instruction Manual 0101-8051-2, Copyright 1985-The BOC Group, Inc. pp. 15, 55, 141, 143, 145 and 147.

Primary Examiner—C. L. Albritton
Attorney, Agent, or Firm—David A. Draegert; Larry R. Cassett

[57] ABSTRACT

An electron-beam heated vapor source for operation in vacuum is disclosed. The source comprises a magnet and a pair of parallel pole plates for deflecting the beam from an electron-beam gun through an angle of approximately 270° into a crucible containing material to be vaporized by evaporation, sublimation or other process. A pole rod extends from each of the pole plates into the space between them. A means is provided for precisely adjusting the distance separating the pole rods while the vapor source is in vacuum. This adjustment enables the impact area of the beam, and thus, the deposition rate or other impact area related parameter to be optimized while the vapor source is in operation. Preferably, each pole rod extends through a clearance hole in the pole plate and the adjustment means comprises a rack integral with the rod and a pinion which can be driven by a control means located outside the vacuum chamber.

20 Claims, 6 Drawing Figures

VAPOR SOURCE ASSEMBLY WITH ADJUSTABLE MAGNETIC POLE PIECES

BACKGROUND OF THE INVENTION

The invention relates to an electron-beam heated vapor source assembly for use in the field of vaporizing materials in high vacuum and, especially the field of depositing multi-layer coatings on substrates.

Electron-beam heated vapor sources are frequently used in vacuum coating systems. One such vapor source is described in U.S. Pat. No. 3,710,072, issued to Robert L. Schrader and Kazumi N. Tsujimoto, and assigned to the assignee of the present application. This vapor source comprised a single crucible, a single electron-beam gun, and a magnetic means for deflecting the electron beam through an arcuate path from the electron-beam gun to the crucible. The magnetic deflecting means included two large, parallel plates of magnetic material which were positioned on opposite sides of the electron-beam gun and extended on opposite sides of the crucible. The plates were polarized by interconnecting them with a single permanent magnet near their ends which were further from the electron-beam gun. The electron beam was deflected by the magnetic field produced between the pole pieces. Three electro magnetic coils were arranged in a generally U-shaped structure to enable the beam to be swept across the crucible. This prior vapor source also included a pair of small plates, one bolted to the upper edge of each large pole plate. The small plate extended into the space between the large pole plates and enabled the production of a beam having a small cross section when it entered the crucible. The specification of this U.S. Pat. No. 3,710,072, is incorporated herein by reference.

U.S. Pat. No. 3,483,417 described another electron-beam heated vapor deposition source in which the beam was deflected by two large, parallel plates. This patent discloses interchangeable pole rods which are threaded into holes in the large plates. The threads enable adjustment of the distance which the pole rods extend into the space between the pole plates.

Electron-beam heated vapor sources having a plurality of crucibles for vaporizing different materials are also known. One such source is the model STIH-270-1 four-hearth source sold by the Temescal Division of the assignee of the present application. This source has a hearth assembly containing four separate compartments for material to be vaporized and a means for rotating the assembly about an axis so that each compartment may be placed into the path of the electron beam.

SUMMARY OF THE INVENTION

The present invention relates to a vapor source for operation in vacuum. The source comprises an electron-beam gun and a hearth or crucible for containing material to be vaporized by evaporation, sublimation or other process. The vapor source has a magnet and a pair of parallel pole plates for deflecting the beam from the gun onto the crucible. The invention is particularly directed to a vapor source in which the beam is deflected through an angle in the range from about 240° to about 300° between the gun and the crucible. A pole rod extends from each of the pole plates into the space between them. A means is provided for precisely adjusting the distance separating the pole rods while the vapor source is in vacuum. This adjustment enables the impact area of the beam, and thus, the deposition rate or other impact area related parameter to be optimized while the vapor source is in operation. Preferably, the adjustment means comprises a rack integral with the rod and a pinion which can be driven by a control means located outside the vacuum chamber.

DESCRIPTION OF THE PREFERRED EMBODIMENTS

Figure 1:
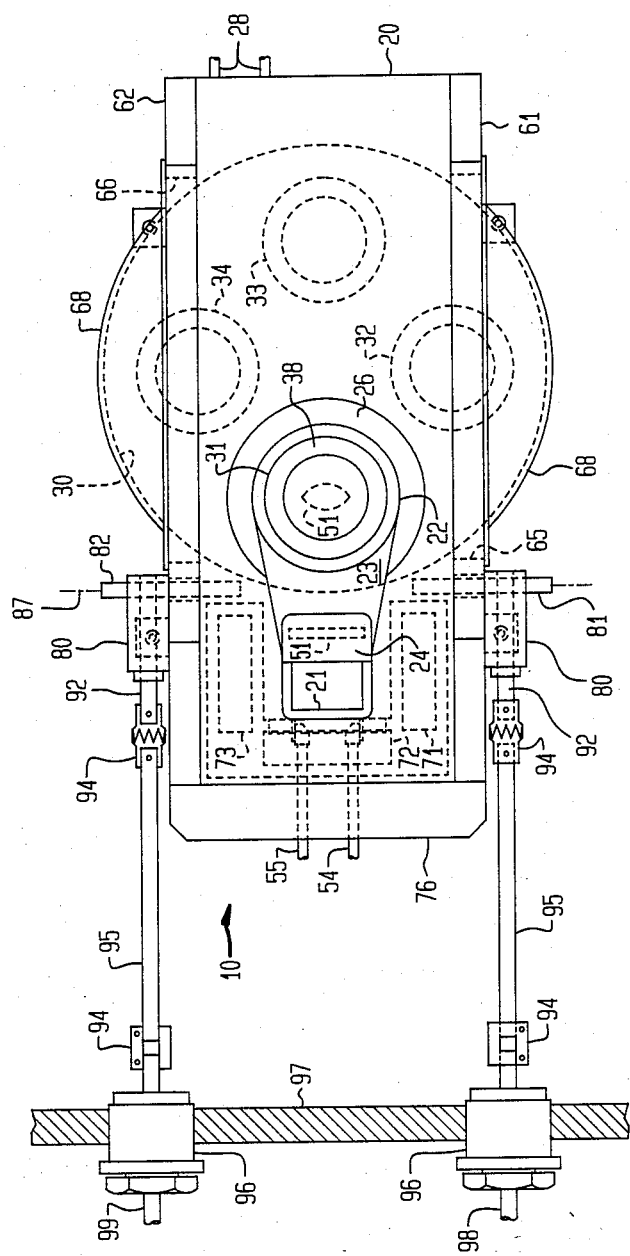
FIG. 1 is a plan view of a vapor source assembly according to the present invention.

A preferred embodiment of the present invention is illustrated in FIGS. 1-5. This vapor source 10 comprises a hearth assembly 30, an electron-beam gun 50, and a magnetic means for deflecting the electron beam from the gun onto the hearth. The magnetic deflecting means comprises a primary deflecting means 60, an electro-magnetic sweeping assembly 70, a pair of adjustable pole rod assemblies 80, and means for adjusting the extension of the pole rods.

The support structure for the vapor source 10 comprises a bottom plate 11, a top plate 20, and a pair of pole pieces 61, 62. Bottom plate 11 is a rectangular plate of non-magnetic material, preferably stainless steel, which extends between the two pole plates. The bottom plate is supported on a base plate 12 which may be the wall of the vacuum chamber. The bottom plate 11 and base plate 12 are separated by spacers 13 held in place by bolts 14.

Top plate 20 is also a rectangular plate of a non-magnetic material, preferably copper, which extends between the top edges of the parallel pole plates 61, 62. The top plate has a generally rectangular opening 21 for enabling the electron beam to pass through the plate from the electron gun located below the top plate. The top plate has a circular opening 22 through which the beam passes back through the top plate onto the hearth located below the top plate. The openings 21 and 22 are separated by a bridge 23 which covers the electron beam gun and protects it from falling debris. To maximize the extent of the protective bridge, rectangular opening 21 has a slanted wall section 24 and circular opening 22 has a frustroconical wall section 26. Because the preferred embodiment is designed for operation with high electron beam powers, top plate 20 is provided with inlet and outlet water connectors 28 and a passage (not shown) interior to plate 20 for circulating cooling water.

The material to be vaporized by evaporation or sublimation is placed on a hearth in the path of the electron beam. The hearth may comprise a single crucible, but the preferred embodiment has four crucibles 31-34, each of which can be aligned with circular opening 22 in the top plate. Preferably, each crucible has a flat, circular bottom 36 and a frustroconical wall section 38. If desired, automatic wire feeders or other means may be used to replenish the supply of vaporizable material so as to maintain the desired level 37 of material in the crucible. The multiple crucibles may be formed from one block of material, but the preferred embodiment utilizes four separate crucibles. This enables the composition and the dimensions of each crucible to be selected according to the quantity and physical and chemical properties of the materials to be vaporized.

The four crucibles are mounted on a carousel 40 which comprises a support plate 41 which is mounted on a shaft 42 for rotation about an axis 43. Preferably, a Ferrofluidic rotational feed-through 45 is used to enable the crucible to be rotated by a drive means located outside the vacuum system. Preferably, the rotatable shaft 42 is hollow and surrounds a coaxial interior pipe 44 which enables water from an inlet connector 46 to pass through the interior of 47 the pipe to connect with internal passageways in support plate 41 and the crucibles 31–34 and return via a passage 48 external to the pipe to a water outlet connector 49.

The conventional electron-beam gun 50 is mounted on an extension of the bottom plate 11. The gun comprises a filament 51, a beam former 52 and an anode 53 which is normally grounded. Opposite ends of the filament 51 are connected to electric terminals 54 and 55 which can be connected to the negative terminals of a conventional electron-beam power supply.

The primary magnetic deflecting means 60 comprises a pair of parallel plates 61, 62 of magnetic material. These plates make intimate contact with opposite ends of a permanent magnet 63 which is mounted on the bottom plate 11. If greater magnetic field strength is required, a second permanent magnet 64 may be installed. In order to increase the field strength in the region of the beam, the separation between the pole plates is reduced by providing an opening 66 in each pole plate through which hearth assembly 30 may protrude. A pair of cover plates 68 are provided to protect the protruding crucibles from falling debris.

Figure 2:
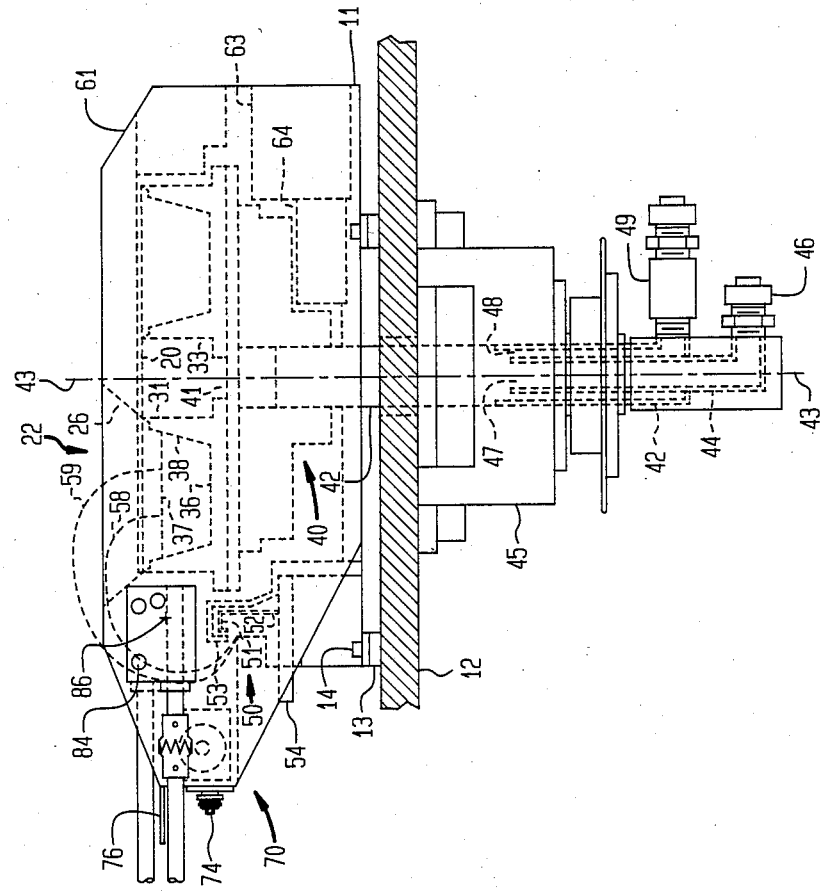
FIG. 2 is a side view of the vapor source assembly of FIG. 1.
Figure 3:
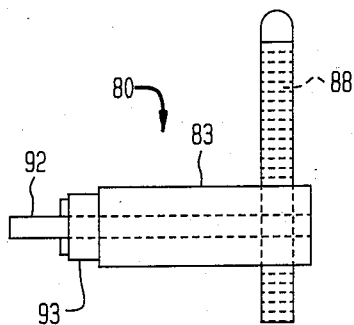
FIG. 3 is a plan view of an adjustable pole rod assembly according to the invention.
Figure 4:
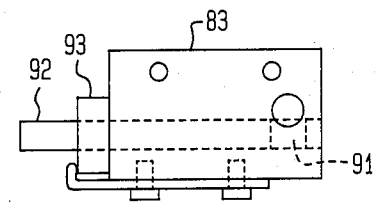
FIG. 4 is a side view of the pole rod assembly of FIG. 4.

The path of the electron beam is indicated by dotted lines 58 and 59 in FIG. 2. From the electron beam gun, the beam is initially directed generally horizontally in a direction away from the crucible. The magnetic field first deflects the beam through an angle of approximately 90° so that the beam passes upward through top plate 20 via the rectangular opening 21. The beam is further deflected to become parallel to the top plate and then deflected downward through circular opening 22 onto an area 57 on the desired level 37 of material in the crucible aligned below this opening.

In some applications, it is desirable to use a broad, diffuse beam which has an impact area which is smaller but approximately the same size as the cross sectional area of the crucible. In the preferred embodiment, the strength of the magnetic field between the parallel plates 61, 62 is selected so that such a diffuse beam is obtained. In other applications, it is desirable to use a narrower beam having a smaller impact area when it enters the crucible. Such a narrower beam can be obtained by increasing the magnetic field in a region along the beam's path so as to focus the beam.

To accomplish such focusing, the preferred embodiment includes two pole rod assemblies 80 having pole rods 81, 82. Each rod passes through a clearance hole 85 in the one of the pole plates and extends into the region between the pole plates in the vicinity where the electron beam passes. Each assembly comprises a body 83 which is attached to a pole plate by screws 84. The pole rods are a magnetic material such as steel. In the preferred embodiment, the rods are circular cylinders but they could be rectangular or have tapered or flared ends extending into the vicinity of the beam. The clearance hole 85 through which a pole rod extends has a diameter only slightly larger than the rod so as to enable a low reluctance magnetic path from the pole plate to the pole rod. For a rod of 0.312 inches in diameter, a clearance hole diameter of 0.323 inches with a clearance of 0.005 inches is preferred. A larger clearance hole produces erratic deflections because of variations in the contact area between the pole plate and the pole rod. Similar erratic deflections and a tendency to seize were observed when a threaded rod and hole were used. Preferably, the pole rod 81 and 82 extend along a common axis 87. Because the magnetic field of the parallel pole plates is inhomogeneous along the path of the electron beam, the optimum position of the pole rods is best determined by experiment. For a beam from a linear filament deflected through an angle of 270° in a plane perpendicular to the filament, experiments showed that the pole rods should be parallel to the filament, approximately in the plane 37 of impact of the beam on material in the crucible, and near the intersection of this plane with the perpendicular plane which passes through the filament. This intersection is marked with a cross 86 in FIG. 2. It was found that this location was preferable to having the axis of the pole rods along the upper edge of the pole plates. The distance from this intersection of planes to the center of the pole rod is preferably less than about twice the diameter of the pole rod. A distance of less than about one rod diameter is even more preferred. If the cross-section of the rod is square or other non-circular shape, then an average dimension should be use for the rod "diameter". Since the pole rods produce a cylindrical magnetic lens, their effect is reduced if their axis is further from the path of the beam. The rods are subject to heating the possible damage if their axis is too close to the beam.

An adjustment means is provided for varying the distance to which each pole rod extends. Each rod is provided with a rack 88 machined into the rod, and the rack is engaged by a pinion 91. The pinion is rotated by a stub shaft 92 which is mounted for rotation in a collar 93 in the body 83 of the assembly. Conventional shaft couplings 94, extension shaft 95, and a Ferrofluidic rotary feed through 96 in the wall 97 of the vacuum chamber enable the rack and pinion to be operated from outside the vacuum system either manually or by means of a motor attached to the external shafts 98 and 99.

Figure 5:
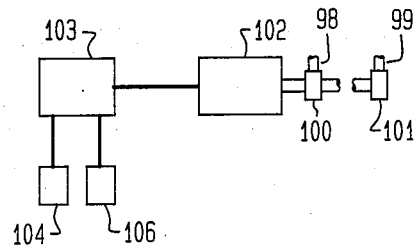
FIG. 5 is a schematic diagram of a control system for operating the vapor source assembly according to the present invention.

Preferably, as shown in FIG. 5, the two pole rods are driven by gear assemblies 100 and 101 and a single electric motor 102 connected to a control box 103 which synchronously drives the control rods in opposite directions. Alternatively, the two pole rods can be driven by individual electric motors connected electrically in parallel.

In any vaporization application, the optimum beam diameter depends upon a number of factors, primarily the physical properties of the material to be vaporized but also the dimensions and composition of the containing crucible. The optimum extension of the pole rods is easily determined by experiment. Once the optimum is determined, the control circuit 103 may be programmed to set the appropriate pole rod extension for each situation. When different materials are to be evaporated from different crucibles, a conventional rotational position sensor 104 may be connected to the control circuit to automatically adjust the pole rods when the crucible is changed. Alternately, if it is desired to obtain maximum or other optimum deposition rate, a deposition rate monitor 106 may be connected to the control circuit so as to provide a feedback control loop.

In some vaporization applications, it is desirable to use a narrow electron beam, having a small cross sectional area when it enters the crucible and to repetitively sweep the impact area over the larger area of the crucible. The preferred embodiment includes a conventional beam sweeping assembly 70 comprising three electro-magnetic coils 71-73 which are formed in a generally U-shaped assembly and connected to four electric terminals 74 which may be connected to a conventional X-Y beam sweeping circuits. A vapor shield 76 protects these terminals from falling debris.

Figure 6:
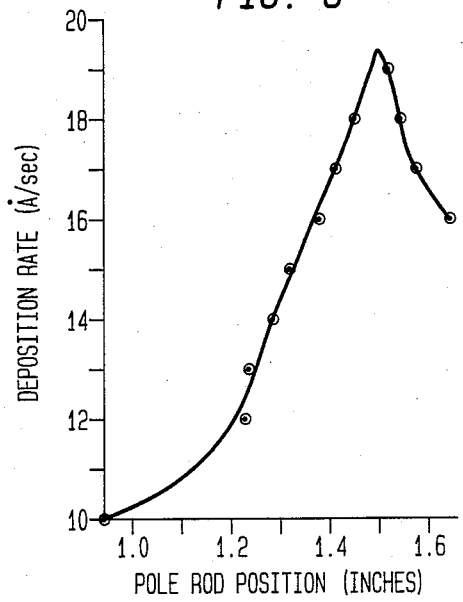
FIG. 6 is a graph showing the deposition rate as a function of displacement of the pole rods for one embodiment of the invention.

The impact zone of an electron beam deflected through 240° to 300° is much better defined than that for a beam deflected through 90° or 180°. Further, it has been known that the deposition rate of certain materials was dependent upon the size of the impact zone and that the size could be varied with pole piece extensions. The applicant has discovered that the rate of deposition of aluminum alloys with a 270° deflecting electron beam gun is surprisingly sensitive to the position of the pole piece extensions. In a preferred embodiment of a vapor source of FIGS. 1 and 2 having a separation distance of 5.2 inches between parallel pole plates, a displacement of each pole rod of only 0.25 inches was found to increase the deposition rate by 60°. This can be seen from FIG. 6 which shows the measured rate of deposition of an aluminum alloy with an electron beam power of 10 kW as a function of the position of the pole rods. The horizontal axis in FIG. 6 is the distance from the center point to the nearest end of each pole rod. As the separation of the pole rods increased, the deposition rate increased to a maximum and then decreased. Data for greater separations were not obtained because the beam impact zone would have become larger than the crucible.

What is claimed is:

1. A vapor source assembly for operation In vacuum, comprising:
   an electron-beam gun,
   a crucible for supporting material to be vaporized,
   a magnet,
   a pair of parallel magnetic pole plates in contact with the magnet and alligned so that the beam from the electron-beam gur is deflected through an angle in the range from 240° to 300° onto the crucible,
   a pair of pole rods each of which passes through a clearance hole in one of the pole plates, extends into the space between the plates and is positioned so as to be capable of altering the cross-sectional area of the beam as it impacts on the material supported by the crucible, wherein each pole rod and its clearance hole are sized to enable a constant, low reluctance magnetic path between the pole pieces and the pole rod as the pole rod moves in the clearance hole, and
   a rod adjustment means for precisely adjusting the distance separating the pole rods while the vapor source is in vacuum.

2. The vapor source assembly of claim 1 wherein each rod comprises a rack and the rod adjustment means comprises a pinion.

3. A vapor source assembly according to claim 2 wherein the electron beam gun has a linear filament perpendicular to the pole plates, and the pole rods have a common axis perpendicular to the pole plates and located within about two rod diameters of the intersection of the plane containing the level of material in the crucible with a perpendicular plane passing through the filament.

4. A vapor source assembly for operation in vacuum, comprising:
   an electron-beam gun,
   a crucible for supporting material to be vaporized,
   a magnet,
   a pair of parallel magnetic pole plates in contact with the magnet and alligned so that the beam from the electron-beam gun is deflected through an angle in the range from 240° to 300° onto the crucible,
   a pole rod extending from each of the pole plates, extending into the space between them and positioned so as to be capable of altering the cross-sectional area of the beam as it impacts on the material supported by the crucible,
   a rod adjustment means for precisely adjusting the distance separating the pole rods while the vapor source is in vacuum, and
   means for measuring the deposition rate and for adjusting the separation of the pole rods in response.

5. The vapor source assembly according to claim 4 further comprising:
   a plurality of crucibles, and
   a means for detecting which crucible is in the path of the electron beam and for adjusting the separation of the pole rods in response.

6. The vapor source assembly according to claim 4 wherein each pole rod extends through a clearance hole in a pole plate.

7. The vapor source assembly of claim 6 wherein each rod comprises a rack and the rod adjustment means comprises a pinion.

8. The vapor source assembly according to claim 7 further comprising:
   a plurality of crucibles, and
   a means for detecting which crucible is in the path of the electron beam and for adjusting the separation of the pole rods in response.

9. A vapor source assembly according to claim 8 wherein the electron beam gun has a linear filament perpendicular to the pole plates, and the pole rods have a common axis perpendicular to the pole plates and located within about two rod diameters of the intersection of the plane containing the level of material in the cruible with a perpendicular plane passing through the filament.

10. The vapor source assembly according to claim 1, wherein the clearance between each pole rod and its clearance hole is about 0.005 inches.

11. The vapor source assembly according to claim 1 wherein the pole rods and clearance holes are circular cylinders and the diameter of the hole is about 0.01 inches greater than the diameter of the rod.

12. The vapor source according to claim 11 wherein each rod comprises a rack and the rod adjustment means comprises a pinion.

13. A vapor source assembly for operation in vacuum, comprising:
   an electron-beam gun,
   a crucible for supporting material to be vaporized,
   a magnet, a pair of parallel magnetic pole plates in contact with the magnet and alligned so that the beam from the electron-beam gun is deflected through an angle in the range from 240° to 300° onto the crucible, a pole rod extending from each of the pole plates, extending into the space between them and positioned so as to be capable of altering the cross-sectional area of the beam as it impacts on the material supported by the crucible, a rod adjustment means for preceisely adjusting the distance separating the pole rods while the vapor source is in vacuum, and means for determining a parameter upon which the optimum cross-sectional area of the beam depends and for adjusting the separation of the pole rods in response.

14. The vapor source assemble according to claim 13 further comprising:
a plurality of crucibles, and
wherein the parameter is the identification of which crucible is in the path of the electron beam.

15. The vapor source assembly according to claim 13 wherein each pole rod extends through a clearance hole in a pole plate.

16. The vapor source assembly of claim 15 wherein each rod comprises a rack and the rod adjustment means comprises a pinion.

17. The vapor source assembly according to claim 16 further comprising:
a plurality of crucibles, and
wherein the parameter is the identification of which crucible is in the path of the electron beam.

18. The vapor source assembly according to claim 13 wherein the parameter is the deposition rate.

19. The vapor source assembly according to claim 18 wherein each pole rod extends through a clearance hole in a pole plate.

20. The vapor source assembly of claim 19 wherein each rod comprises a rack and the rod adjustment means comprises a pinion.

* * * * *

UNITED STATES PATENT AND TRADEMARK OFFICE
CERTIFICATE OF CORRECTION

PATENT NO. : 4,728,772
DATED      : March 1, 1988
INVENTOR(S): P. A. Joel SMITH

It is certified that error appears in the above-identified patent and that said Letters Patent is hereby corrected as shown below:

Column 5, line 32, "60°" should read -- 60% --.
Column 5, claim 1, line 44, "ln" should read -- in --.
Column 5, claim 1, line 51, "gur" should read -- gun --.
Column 6, claim 9, line 52, "cruible" should read -- crucible --.
Column 7, claim 14, line 16, "assemble" should read -- assembly --.

Signed and Sealed this

Sixteenth Day of May, 1989

Attest:

DONALD J. QUIGG

*Attesting Officer*        *Commissioner of Patents and Trademarks*